United States Patent [19]
Ben-Arie et al.

[11] Patent Number: 6,032,168
[45] Date of Patent: Feb. 29, 2000

[54] COMPUTER SYSTEM TO PERFORM A FILTER OPERATION USING A LOGARITHM AND INVERSE-LOGARITHM CONVERTER AND METHODS THEREOF

[75] Inventors: Yaron Ben-Arie, Ramat Gan; Effi Orian, Pardessia; Itzhak Barak, Tel Aviv; Jacob Kirschenbaum, Hadera; Doron Kolton, Netanya, all of Israel; Shay-Ping Thomas Wang, Long Grove; Shao-Wei Pan, Lake Zurich, both of Ill.; Stephen-Chih-Hung Ma, Mesa, Ariz.

[73] Assignee: Motorola, Inc., Schaumburg, Ill.

[21] Appl. No.: 08/911,711

[22] Filed: Aug. 15, 1997

[51] Int. Cl.[7] ........................................................ G06F 7/00
[52] U.S. Cl. ............................................ 708/600; 708/503
[58] Field of Search ............................... 364/754, 724.01, 364/724.19, 748.5, 726, 746.15, 748.18, 736.04; 708/503, 587, 600, 300, 321, 620, 400, 420, 405, 315

[56] References Cited

U.S. PATENT DOCUMENTS

| | | | |
|---|---|---|---|
| 4,805,129 | 2/1989 | David ................................. | 364/724.01 |
| 5,163,017 | 11/1992 | Wong et al. ............................. | 364/726 |
| 5,204,830 | 4/1993 | Wang et al. ............................. | 364/754 |
| 5,517,435 | 5/1996 | Sugiyama ............................ | 364/724.19 |
| 5,685,008 | 11/1997 | Pan et al. ................................ | 395/800 |
| 5,689,450 | 11/1997 | Kurokawa et al. ...................... | 364/736 |
| 5,696,986 | 12/1997 | Pan et al. ................................ | 395/800 |
| 5,703,801 | 12/1997 | Pan et al. ............................. | 364/748.5 |
| 5,771,391 | 6/1998 | Lloyd et al. ................................ | 712/1 |
| 5,838,725 | 11/1998 | Gurusami et al. ...................... | 375/229 |
| 5,951,628 | 9/1999 | Pan et al. ................................ | 708/420 |
| 5,968,112 | 10/1999 | Kirschenbaum et al. .............. | 708/405 |

*Primary Examiner*—Joseph E. Palys
*Assistant Examiner*—Rijue Mai
*Attorney, Agent, or Firm*—James E. Gauger

[57] ABSTRACT

In a parallel computer system having N parallel computing units a data pipeline connects all the computing units. In addition the computing units are coupled to a random access memory so that each computing unit is assigned to one column of the memory array. To perform a digital signal processing filter operation the required coefficients are stored in the memory so that one or more different filter operations can be carried out in an interleaved way.

9 Claims, 6 Drawing Sheets ically imple-

COMPUTER SYSTEM TO PERFORM A FILTER OPERATION USING A LOGARITHM AND INVERSE-LOGARITHM CONVERTER AND METHODS THEREOF

RELATED INVENTIONS

The present invention is related to the following inventions which are assigned to the same assignee as the present invention:

(1) "Computer Processor Utilizing Logarithmic Conversion and Method of Use thereof, having Ser. No. 08/430,158, filed on Mar. 13, 1995.

(2) "Exponentiator Circuit Utilizing Shift Register and Method of Using Same", having Ser. No. 08/401,515, filed on Mar. 10, 1995, now U.S. Pat. No. 5,553,012.

(3) "Accumulator Circuit and Method of Use Thereof", having Ser. No. 08/455,927, filed on May 31, 1995, now U.S. Pat. No. 5,644,520.

(4) "Logarithm/Inverse-Logarithm Converter and Method of Using Same", having Ser. No. 08/381,368, filed on Jan. 31, 1995, now U.S. Pat. No. 5,642,305.

(5) "Logarithm/Inverse-Logarithm Converter Utilizing Second Order Term and Method of Using Same", having Ser. No. 08/382,467, filed on Jan. 31, 1995, now U.S. Pat. No. 5,703,801.

(6) "Logarithm/Inverse-Logarithm Converter Utilizing Linear Interpolation and Method of Using Same", having Ser. No. 08/391,880, filed on Feb. 22, 1995, now U.S. Pat. No. 5,600,581.

(7) "Logarithm/Inverse-Logarithm Converter Utilizing a Truncated Taylor Series and Method of Use Thereof", having Ser. No. 08/381,167, filed on Jan. 31, 1995, now U.S. Pat. No. 5,604,691.

(8) "Logarithm Converter Utilizing Offset and Method of Use Thereof", having Ser. No. 08/508,365, filed on Jul. 28, 1995, now U.S. Pat. No. 5,629,884.

(9) "Computer Processor Using Logarithmic Conversion and Method of Use Thereof", having Ser. No. 430,158, filed on Mar. 13, 1995.

TECHNICAL FIELD OF THE INVENTION

The present invention relates generally to digital signal processing and, in particular, to a computer system and method for performing a filter operation.

BACKGROUND OF THE INVENTION

Computer processors are well known and widely used for a variety of purposes. One application of computer processors is digital signal processing (DSP). By definition, digital signal processing is connected with the representation of signals by sequences of numbers or symbols and the processing of these signals. DSP has a wide variety of applications and its importance is evident in such fields as pattern recognition, radio communications, telecommunications, radar, biomedical engineering, and many others.

At the heart of every DSP system is a computer processor that performs mathematical operations on signals. Generally, signals received by a DSP system are first converted to a digital format used by the computer processor. Then the computer processor executes a series of mathematical operations on the digitized signal. The purpose of these operations can be to estimate characteristic parameters of the signal or to transform the signal into a form that is in some sense more desirable. Such operations typically implement complicated mathematics and entail intensive numerical processing. Examples of mathematical operations that may be performed in DSP systems include matrix multiplication, matrix-inversion, Fast Fourier Transforms (FFT), auto and cross correlation, Discrete Cosine Transforms (DCT), polynomial equations, and difference equations in general, such as those used to approximate Infinite Impulse Response (IIR) and Finite Impulse Response (FIR) filters.

Computer processors vary considerably in design and function. One aspect of a processor design is its architecture. Generally, the term computer architecture refers to the instruction set and organization of a processor. An instruction set is a group of programmer-visible instructions used to program the processor. The organization of a processor, on the other hand, refers to its overall structure and composition of computational resources, for example, the bus structure, memory arrangement, and number of processing elements. A processing element may be as simple as an adder circuit that sums two values, or it may be a complex as a central processing unit (CPU) that performs a wide variety of different operations.

In a computer, a number of different organizational techniques can be used for increasing execution speed. One technique is execution overlap. Execution overlap is based on the notion of operating a computer like an assembly line with an unending series of operations in various stages of completion. Execution overlap allows these operations to be overlapped and executed simultaneously.

One commonly used form of execution overlap is pipelining. In a computer, pipelining is an implementation technique that allows a sequence of the same operations to be performed on different arguments. Computation to be done for a specific instruction is broken into smaller pieces, i.e., operations, each of which takes a fraction of the time needed to complete the entire instruction. Each of these pieces is called a pipe stage. The stages are connected in a sequence to form a pipeline—arguments of the instruction enter at one end, are processed through the stages, and exit at the other end.

These are many different architectures, ranging from complex-instruction-set-computer (CISC) to reduced-instruction-set-computer (RISC) based architectures. In addition, some architectures have only one processing element, while others include two or more processing elements. Despite differences in architectures, all computer processors have a common goal, which is to provide the highest performance at the lowest cost. However, the performance of a computer processor is highly dependent on the problem to which the processor is applied, and few, if any, low-cost computer processors are capable of performing the mathematical operations listed above at speeds required for some of today's more demanding applications. For example, MPEG data compression of an NTSC television signal can only be performed using expensive supercomputers or special purpose hardware.

Many other applications, such as matrix transformations in real-time graphics, require data throughput rates that exceed the capabilities of inexpensive, single processors, such as micro processors and commercially available DSP chips. Instead, these applications require the use of costly, multiprocessor or multiple-processor computers. Although multiprocessor computers typically have higher throughput rates, they also include complex instruction sets and are generally difficult to program.

One application which is particularly expensive in terms of the required computing power is the performance of digital filter operations, such as finite impulse response or infinite impulse response filter operations. A common prior art approach for the implementation of a digital signal processing operation of this kind is the usage of a single dedicated digital signal processor for a polyphase filter implementation. The problem associated with this prior art approach is that for many real-time applications the computing throughput of a dedicated digital signal processor is not sufficient.

As an alternative for high speed applications processor chips can be used which are designed for a specific application purpose and a specific filter operation. Such custom made chip designs are considerably faster as compared to a general purpose digital signal processor. The draw backs of such a design are its inflexibility, high cost, inefficient silicon implementation and inefficient power management.

There is therefore a need to provide an improved computer system and method for performing filter operation.

SUMMARY OF THE INVENTION

The invention is pointed out with particularity in the appended claims. Preferred embodiments of the invention are given in the dependent claims.

The invention is advantageous in that it provides a high speed computer system to perform digital signal operations having a high degree of flexibility. This high degree of flexibility and high speed is combined with an easy programming capability.

The invention can be used in order to implement a filter bank as well as a long filter operation in which the entire system resources are dedicated to the performance of the long filter operation. Also the number of filter coefficients for one filter operation—in principle—is not restricted and can have any number.

By interleaving of different digital filter operations and/or of different parts of the same long digital filter operation the invention allows to provide a high computing throughput. The computing throughput is further increased if the filter coefficients as well as the incoming data samples are logarithmized and thereby put into the logarithm domain. This has the effect that the multiplications which are needed to perform a filter operation can be performed in the log domain so that they in fact become summations.

Further, the invention can be implemented efficiently in a silicon substrate with minimal usage of precious silicon floor space due to the unique architecture of the computer system. Efficient silicon usage also implies that the digital signal processing filter or an electronic apparatus according to the invention can be optimized with respect to power consumption. This is particularly important for such applications as mobile digital devices, such as personal digital assistants and mobile radios or telephones.

BRIEF DESCRIPTION OF THE DRAWINGS

The invention will become more apparent and will be best understood by referring to the following detailed description of a preferred embodiment in conjunction with the accompanying drawings, in which:

With reference to FIG. 1 now a computer system 100 according to the invention is explained in more detail in the following. The computer system 100 has a number N of computing units CU—in this case N=64 computing units CU0, CU1, CU2, . . . , CUj, . . . , CU63. Each of the computing units has a shift register S. In other words the computing unit CU0 has the register S0, the computing unit CU1 has the register S1, the computing unit CU2 has the register S2, . . . , the computing unit CUj has the register Sj, . . . , and the computing unit CU63 has the register S63.

Figure 1:
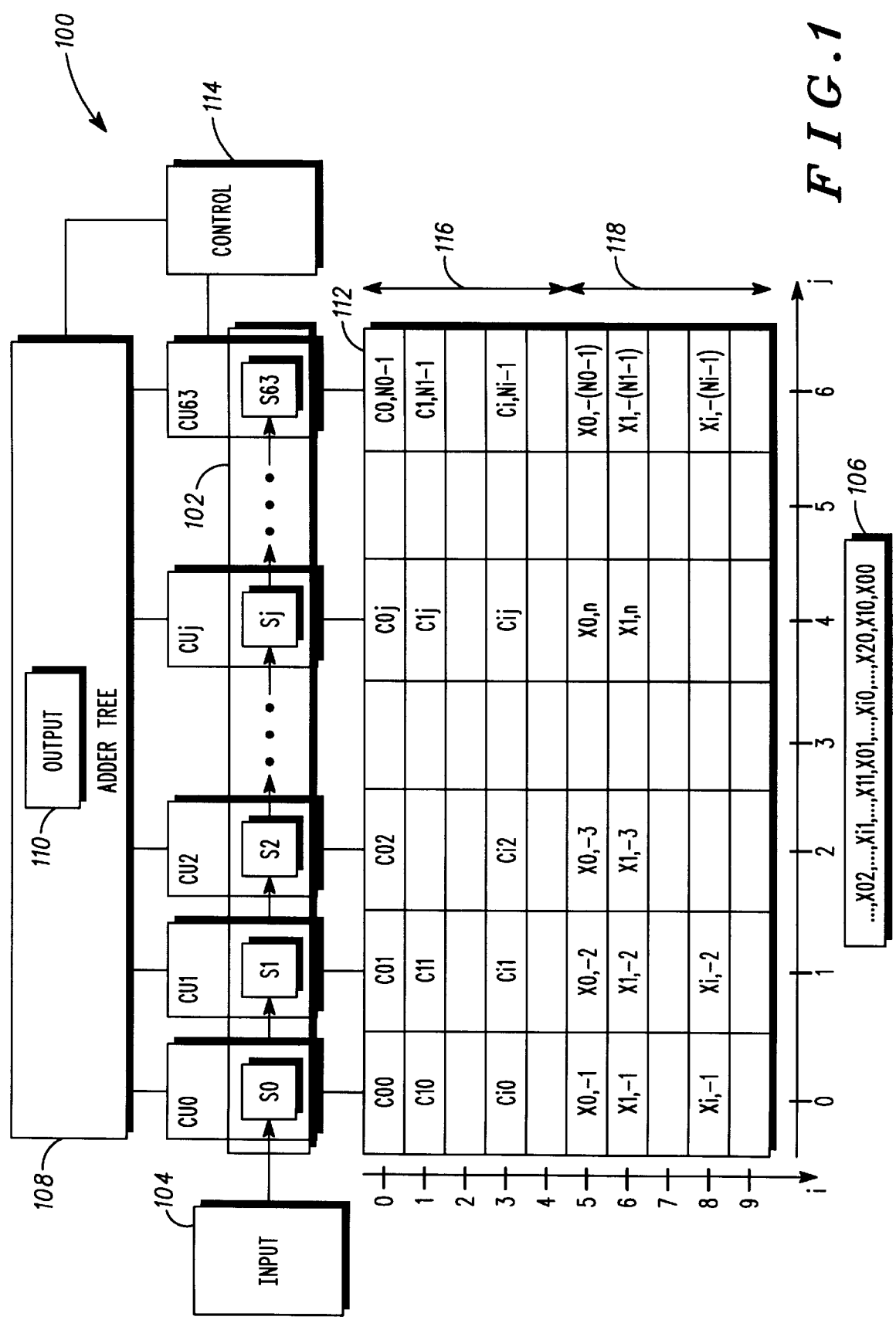
FIG. 1 illustrates a schematic block diagram of a computer system according to the invention.

The registers S of the computing units CU are coupled together to form a data pipeline 102. The data pipeline 102 has an input 104 to receive an input sequence 106 of data words.

Each computing unit CU has its output coupled to an adder tree 108. The adder tree 108 has output 110 from which a final result of a digital signal processing operation is outputted.

Further the computer system 100 comprises a random access memory RAM 112 which has a number of rows and columns. For each computing unit CU there is one dedicated column in the RAM 112 so that the number of columns is at least equal to the number N of parallel computing units. Each computing unit CU has its input coupled to its assigned column of the RAM 112 and can randomly access any data word in this column. For example the computing unit CUj has its input coupled to its assigned column j of the RAM 112, where j=4 in the example considered here.

When a computing unit CU accesses its assigned column in the RAM 112 for a read operation the CU can either store the data word which is read from the RAM 112 in its register S of the data pipeline 102 or within another register of the computing unit CU which is not shown in the drawing.

In the following a memory location in the RAM 112 will be designated by the indices i and j, where i is representative of the row address Ai and j is representative of a column address Aj of the memory location in the RAM 112 referred to.

The computing units CU and the adder tree 108 are coupled to control unit 114 which performs the overall system control of the computer system 100.

The computer system 100 can carry out a plurality of finite impulse response filter operations in an interleaved way. In order to initialize such interleaved finite impulse response filter operations first the RAM 112 has to be fed with the corresponding filter coefficients.

A finite impulse response filter operation i has a number of filter coefficients Ni which will be denoted as $Ci0$, $Ci1$, $Ci2$, . . . , $Cij$, . . . , $Ci,Ni-1$. To perform the finite impulse response filter operation i on a number of samples the following equation 1

$$y_{i,n} = \sum_{j=0}^{N_i-1} c_{ij} * X_{i,n-j}$$ Equation 1 has to be evaluated, where $X_{i,n-j}$ are the input samples and $Y_{i,n}$ is the filtered output value at the time T=n.

Figure 3:
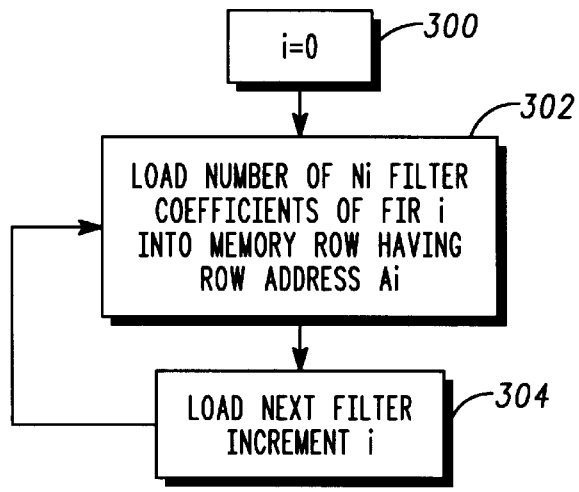
FIG. 3 is a schematic block diagram of a method for initializing the computer systems of FIG. 1 and 2.

With reference to FIG. 3 now it is explained how the RAM 112 of the computer system 100 is initialized with the required coefficients. In step 300 the index i is set to 0. In step 302 the filter coefficients of the first finite impulse response filter operation i=0 are inputted into the RAM 112. Since the digital signal filter operation i has a number of Ni filter coefficients this requires to load the Ni filter coefficients Ci0, Ci1, Ci2, . . . , Cij, . . . , Ci,Ni-1 into the RAM 112. This sequence of filter coefficients is stored in the row of the RAM 112 which has the row address Ai and will be denoted as sequence Ei in the following.

After this operation of loading the sequence Ei of coefficients into the RAM 112 is done for the finite impulse response filter operation i=0 the control goes to step 304 in which i is incremented to prepare for the loading of the next sequence Ei of filter coefficients of the subsequent finite impulse response filter operation i=1. The control goes back from step 304 to step 302 in order to perform the loading of the sequence Ei of filter coefficients into the row having row address Ai. This process continues until all the coefficient of all the finite impulse response filter operations to be carried out by the computer system 100 are loaded into the RAM 112.

In order to evaluate the above equation 1 apart from the filter coefficients Cij a number of Ni data words $X_{i,n-j}$ is needed. The data word $X_{i,n-j}$ is the data word which belongs to an input sequence i of data words which are to be filtered by the finite impulse response filter operation i. To each filter operation i there belongs an input sequence i of data words X which are to be filtered by applying the filter coefficients Cij of the filter operation i according to equation 1.

For example, if in the processing interval of the time T=0 equation 1 is to be evaluated the data words Xi,0; Xi,-1; Xi,-2; Xi,-3; . . . ; Xi,-(Ni-1) are required to perform the calculation. This sequence i consists of the new data word Xi,0 which is inputted in the processing interval of the time T=0 and the old data words which have been inputed before at time T=-1; T=-2; T=-3; . . . ; T=-(Ni-1).

FIG. 1 shows a snap shot of the contents of RAM 112. The RAM has memory areas 116 and 118 which each contain a number of rows of the RAM 112. In the memory area 116 the sequences Ei of filter coefficients are stored.

In the memory area 118 sequences i of data words belonging to filter operations i are stored. Each sequence i occupies one dedicated row having the address Ak. In the example considered here the addresses Ak have a fixed offset from the address row address Ai of the row in which the corresponding sequence Ei is stored.

In the first column of RAM 112 data samples X are stored which belong to different operations i. The data samples X in the first column have the same index j=-1 which indicates that they have the same relative position in their respective input sequence i. The same applies analogously for the other columns of the RAM 112.

The actual input sequence 106 of FIG. 1 contains the separate input sequences i which are interleaved. This means that the input sequence 106 starts with the first new input data word of the first filter operation to be carried out by the computer system 100 in response to the shifting in of the input sequence 106.

In the example considered here which is a snapshot at the time T=0 the first new data word to be shifted in via input 104 into the data pipeline 102 is X00 belonging to the filter operation i=0. The next data word X10 of the input sequence 106 belongs to the input sequence i=1 of the filter operation i=1 and is the first new data word which is shifted in for this filter operation i=1. The same applies analogously for the following data words X20, X30, . . . Xi0, . . . After the first new data words of each filter operation the input sequence 106 contains the second new data words for each filter operation in the same order which—in the example considered here—are the data words X01, X11, . . . , Xi1, . . . . These which are the new data words of the following processing interval T=1.

The same schematics of interleaving consecutive data words in the input sequence 106 having the same relative position in their corresponding input sequence i is applied analogously for the following processing intervals.

When in the processing interval of T=0 which is considered here the first new data word Xi,0 of the input sequence 106 is to be inputted into the input 104 of the data pipeline 102 the control unit 114 requests the computing units CU to access the RAM 112 in order to read the corresponding coefficients Cij of the filter operation i to be carried out. This means that a computing unit CUj reads the coefficient Cij from the memory location Ai, Aj of the RAM 112. As a consequence the entire sequence Ei is read into the computing units CU.

After all the required coefficients Cij have been accessed and loaded from the RAM 112 to the corresponding computing units CUj also old data words need to be accessed in order to prepare for the performance of a filter operation according to equation 1. Therefore the corresponding data words are also accessed in the row having the address Aj in the RAM 112 in which these old data words belonging to the operation i are buffered. Preferably the data words are buffered in a row of the RAM 112 which has a fixed offset from the row address Ai or the row in which the corresponding sequence Ei is stored.

In the example considered here the fixed offset is realized by logically dividing the RAM 112 along a row direction into the memory area 116 and the memory area 118. All the rows having a row address Ai in which sequences of coefficients of filter operations i are stored are located in the memory area 116 whereas sequences i of data words belonging to an operation i are buffered in rows having a row address Ak in the RAM 112, where k has a fixed offset from i. This results in the fact that the sequences Ei of filter coefficients in the memory area 116 and the sequences i of data words in the memory area 118 are stored in the same consecutive order along the column direction.

This has the advantage that accessing of a sequence Ei of coefficients and its corresponding row Ak in which the sequence i of data words is buffered can be done with limited expenditure in terms of control hardware. The access can be controlled by a pointer to the row address Ai which contains the sequence Ei of coefficients of an operation i to be performed. This pointer implies a second pointer which points to the row having a row address Ak, where Ak=Ai+offset. Thereby the memory access is performed very economically and quickly and can easily be programmed into the control unit 114.

When the sequence i of old data words from the row having the row address Ak is accessed by the computing units CU the individual old data words are loaded into the corresponding shift registers S. For the shift register Sj this means that—in order to perform operation i—the memory location ij in the column having column address Aj and in the row having the row address Ak is accessed to read the corresponding old data word of the sequence i.

For the data word X00 considered here that means that the old data word X0,−1 is accessed by the computing unit CU0 and loaded in shift register S0. The same applies analogously for the further data words X0, −2; X0−3, which are loaded into the shift registers S1, S2, . . . .

Next the data words which are loaded into the shift registers S and thus into the pipeline 102 are shifted one position to the right in the datapipeline 102 so that the oldest data word Xi,−(Ni−1) is dropped out of the data pipeline 102 and the first shift register S0 of the data pipeline 102 receives the new data word X00.

Alternatively it is also possible that the data words which are buffered in the row having row address Ak are directly accessed by the computing unit CU in which they are to be processed rather than shifting the accessed data words by one through the data pipeline. If this approach is taken then the data word X0, −1 is accessed by the computing unit CU1 and stored in the shift register S1. The same applies analogously for the following data words X0, −2; X0, −3, . . . which are stored in the shift registers S2, S3, . . . of the computing units CU2, CU3, . . . . Also in this alternative implementation the new data word X00 is shifted into the data pipeline 102 by putting it into the shift register S0 so that the resulting status of the data pipeline 102 is the same as above.

As a consequence to the above initialization each computing unit CU holds one coefficient Cij and a corresponding data word X in its register S. The data word X and the corresponding coefficient Cij are multiplied and the result of the multiplication is outputted by each computing unit CU to the adder tree 108 which sums all partial results obtained from the individual computing units CU.

The final output which is the result of equation 1 is available at the output 110 of the adder tree 108. After this first filter operation is performed further data belonging to the same filter operation can be inputted into the data pipeline 102 so that the same filter coefficients are used to evaluate equation 1 again and again. If a data word which does not belong to the same filter operation is inputted other coefficients need to be loaded into the computing units CU and the state of the data pipeline 102 has to be buffered back into the RAM 112.

This is the case which is considered here with respect to the input sequence 106. The next data word which is shifted in after X00 is the data word Xij, where i=1 and j=0. This means that instead of performing filter operation i=0 now another filter operation i=1 is to be performed. In order to do that the present state of the data pipeline 102 is buffered back to the same row having the address Ak, where k=i+offset= offset=5. The present state of the data pipeline 102 after the processing interval T=0 is X00; X0, −1, X0, −2, X0, −(N0−2).

To buffer this sequence i of data words the previous sequence i of old data words is overwritten in the row having the row address Ak. Next the coefficients Cij where i=1 are accessed by the computing units CU and also the buffered sequence i of old data words belonging to the filter operation i=1 which are stored on row address Ak=1+offset. The data word X10 again is shifted into the data pipeline 102 into the first register S0 whereas the other data words are shifted one position to the right. After this has been done again equation 1 can be evaluated by performing the required multiplications in the computing units CU and summing the partial results in the adder tree 108. The same principle applies analogously for the following data words X20, X30, . . . of the interleaved input sequence 106.

Figure 2:
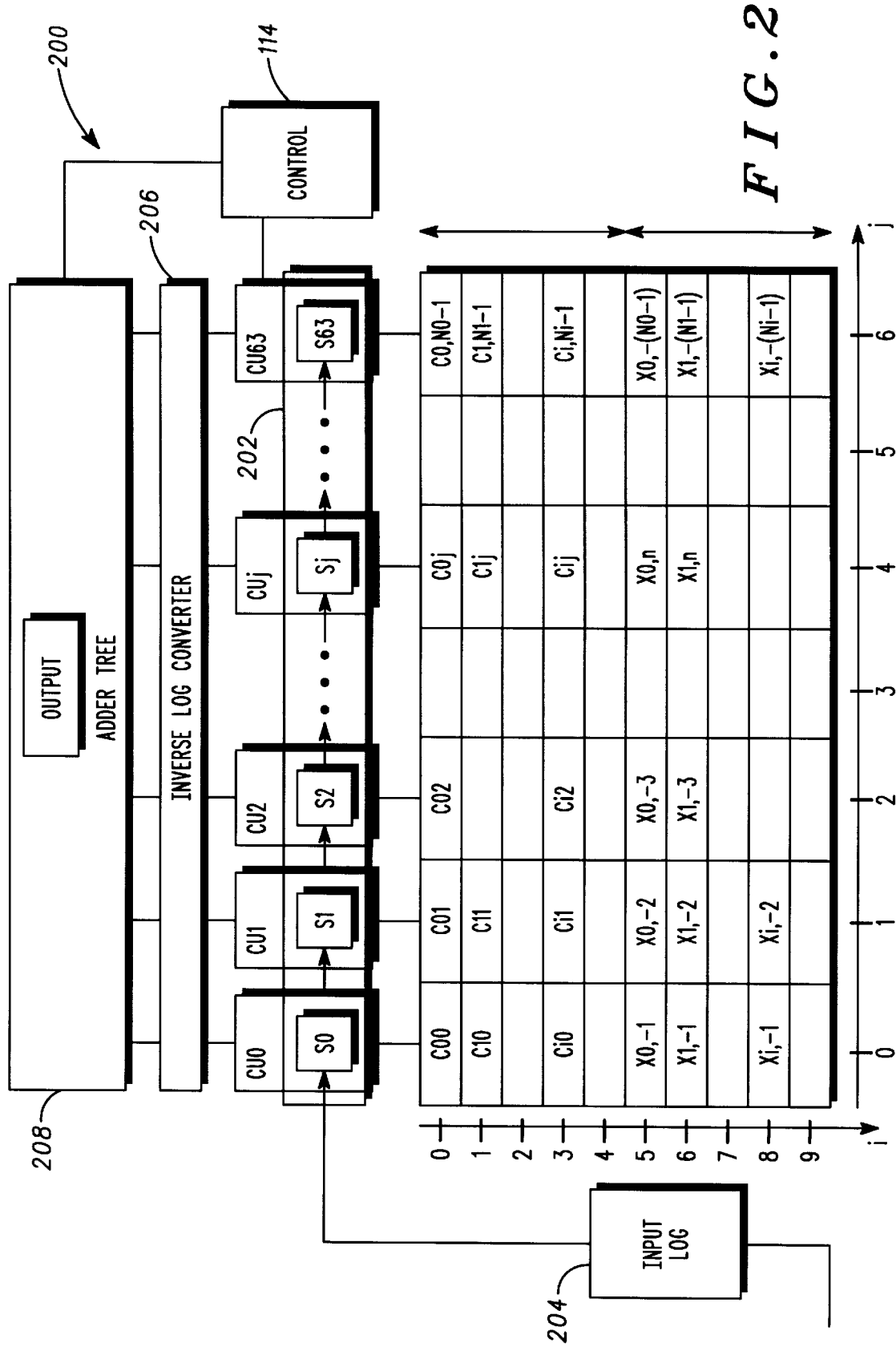
FIG. 2 shows a second embodiment of the computer system of FIG. 1 in which calculations are performed in the log domain.

FIG. 2 shows a modified embodiment of the computer system of FIG. 1. The computer system 200 of FIG. 2 differs from the computer system 100 of FIG. 1 in that the multiplications performed in the computing units CU are carried out in the log domain. This is accomplished by storing the logarithm of all the required filter coefficients Cij and by transforming each data word to be shifted into the data pipeline 202 into the log domain by input log unit 204. Likewise the partial results obtained from the computing units CU are converted back into the normal domain by an inverse log converter 206 before the partial results are added in the adder 208. Various possibilities to realize the circuit structure of FIG. 2 are shown in the above referenced related inventions [1] to [9].

Figure 4:
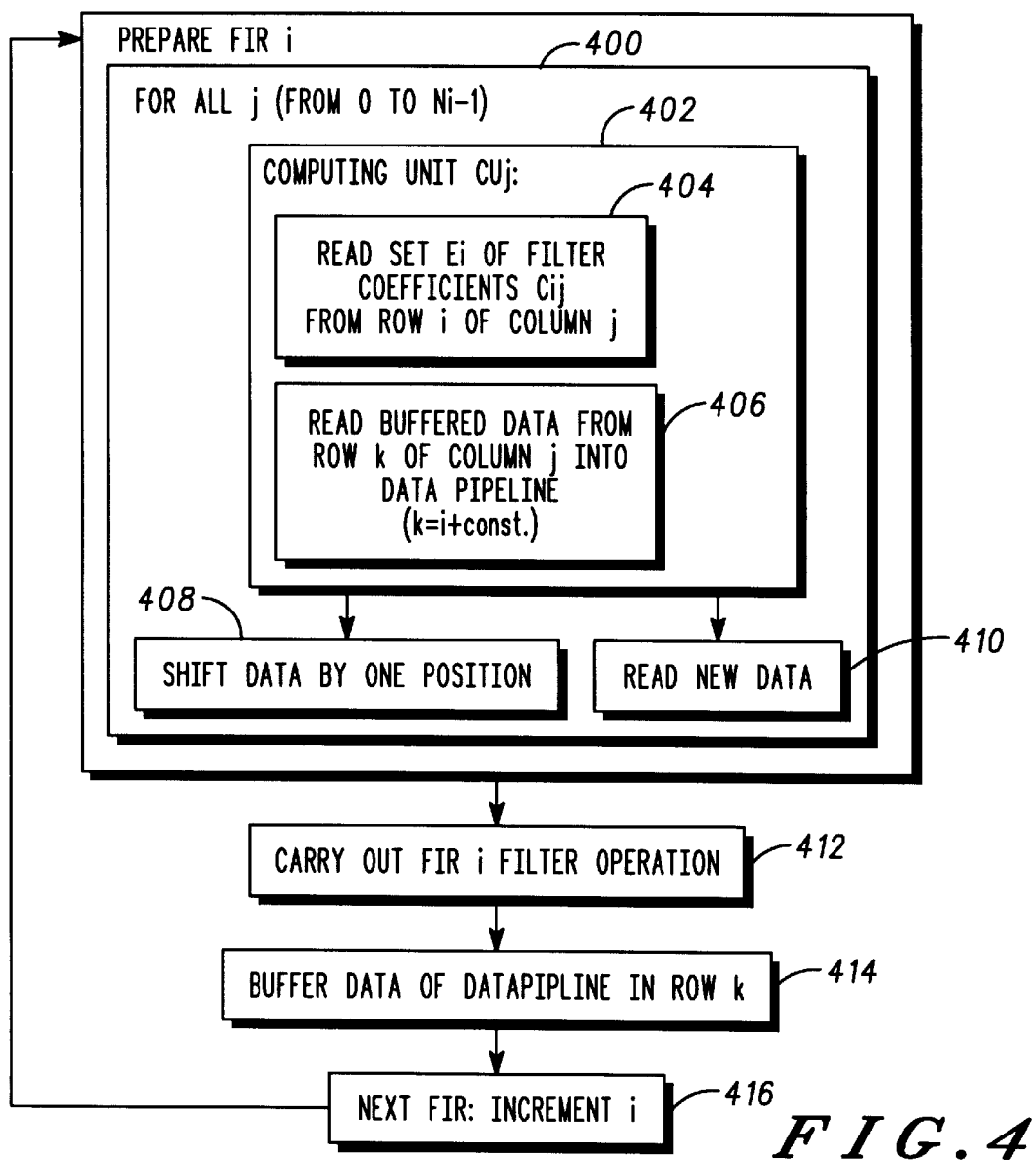
FIG. 4 is a schematic flow chart of a method for performing a number of finite impulse response filter operations according to the invention.

With reference to FIG. 4 now a method for performing a number of finite impulse response filter operations i of the invention is described in the following. In step 400 the filter operation FIRi is prepared. This is done in parallel by involving all the computing units CU in step 402. This means that each computing unit CU has to read the filter coefficient Cij from the row i in column j of a memory array in which the filter coefficients of the relevant sequence Ei are stored like described with respect to the RAM 112 shown in FIG. 1 and 2. This is done in step 404. This way each of the computing units CU holds one filter coefficient Cij which is needed to evaluate equation 1.

In step 406 buffered data are read from the same memory array to initialize a data pipeline which couples the computing units—analogous to the data pipeline 102 of FIG. 1 and the data pipeline 202 of FIG. 2. The buffered data is accessed from row k of the column j, where k=i+a constant value which is the offset.

This results in a separation of the memory array into a first memory area in which the coefficients are stored and a second memory are in which the data words are buffered— analogous to the memory areas 116 and 118 of FIG. 1. Next the data which is read from the row k in step 406 into the data pipeline is shifted by one position in step 408 to provide space for new data which is read in step 410 in parallel. Next the filter operation FIRi is carried out by the computing units in step 412. The computing units provide for partial results which are summed up to produce the final result corresponding to equation 1.

Alternatively it is possible to read the buffered old data words directly into the required positions within the data pipeline in order to avoid the shifting. When the new data word of the sequence to be processed the same initial status of the data pipeline results.

Next the data which is contained in the data pipeline is buffered back to the memory array in its row k from which the original data was read to overwrite the former sequence of buffered data. This is done in step 414.

In step 416 value of i is incremented and the control goes back to step 400 in order to prepare the performance of filter operation FIRi. Next the steps 402 to 412 are carried out again in order to obtain a filtered value according to equation 1 for the filter operation FIRi. The old data of the data pipeline again is buffered in step 414 before i is incremented again in step 416 to prepare for the performance of the next filter operation FIRi.

This sequence of steps is carried out repeatedly until all filter operations FIRi have been carried out once. After this the value of i is reset to i=0 so that the same sequence of filter operations FIRi is applied again to consecutive input values.

Figure 5:
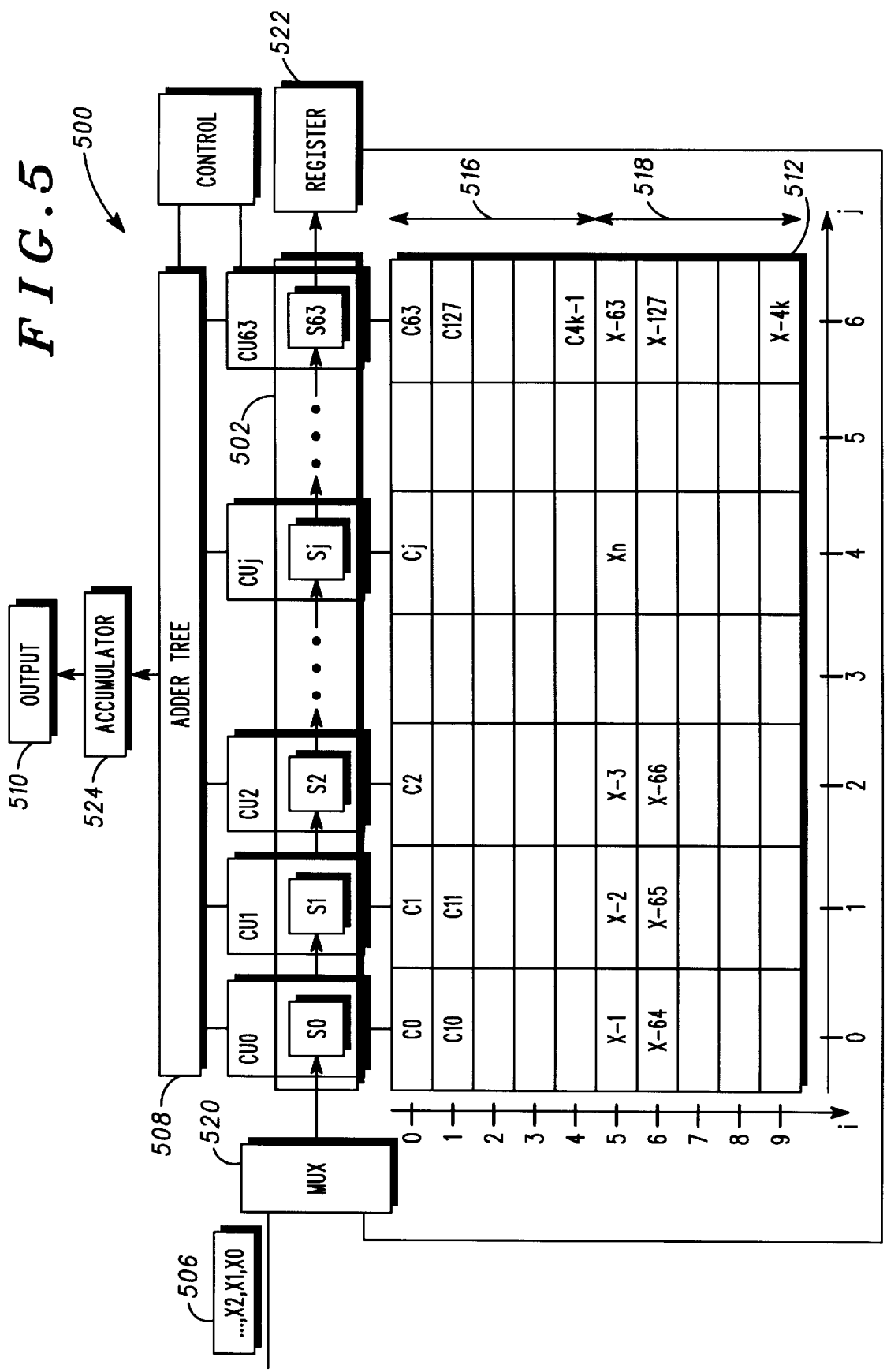
FIG. 5 is a schematic diagram of a second embodiment of the computer system of FIG. 1.

With reference to FIG. 5 now a further embodiment of the invention is described in greater detail. Computer system 500 of FIG. 5 differs from computer system 100 of FIG. 1 and computer system 200 of FIG. 2 in that input sequence 506 is inputted through multiplexer 520 into data pipeline 502 and that at the end of the data pipeline 502 there is a register 522 which allows to feedback data words which drop out at the end of the data pipeline 502 to the multiplexer 520. The reference numerals used in FIG. 5 correspond to respective reference numerals of FIG. 1 and 2 whereby the leading digit in the reference numeral is a "5" instead of "1" or "2", respectively.

These structural modifications of the computer system 500 with respect to the computer systems 100 and 200 of FIG. 1 and 2, respectively, allow to program the control unit of the computer system 500 so that instead of performing a number of different filter operations i one or more filter operations can be performed having a larger number of coefficients than the number of available computing units N.

This is done by inputting a number NL of filter coefficients Cj into first memory area 516 and buffered data words in memory area 518. In the example considered here all the coefficients and all the data words belong to the same long finite impulse response filter operation. The sequence of filter coefficients Cj is stored in a linear order starting from the memory location having row address Ai=0 and column address Aj=0 like it is shown in FIG. 5.

The long filter operation to be performed is described by $$y_n = \sum_{j=0}^{NL-1} c_j * X_{n-j},\quad \text{Equation 2}$$

whereby the sequence of coefficient of Cj is stored in linear order in the RAM 512, and X are the data words of the input sequence to be filtered and y is the resulting filtered output value for the processing time interval T=n.

The equation 2 can also be written as $$y_n = \sum_{j=0}^{N-1} c_j * X_{n-j} + \sum_{j=N}^{2N-1} c_j * X_{n-j} + \ldots + \sum_{j=N*(i-1)}^{NL-1} c_j * X_{n-j},\quad \text{Equation 3}$$

where the summations of the equation 3 can be substituted by the following expressions, $$P_{n,0} = \sum_{j=0}^{N-1} c_j * X_{n-j},\quad \text{Equation 4}$$

$$P_{n,1} = \sum_{j=N}^{2N-1} c_j * X_{n-j},\quad \text{Equation 5}$$

$$\ldots$$

$$P_{n,i-1} = \sum_{j=N*(i-1)}^{NL-1} c_j X_{n-j}.\quad \text{Equation 6}$$

where Pn,0; Pn,1; . . . Pn,i-1 are i partial results.

By substituting the summations in equation 3 by the expressions of equations 4, 5 and 6 the equation 7

$$y_n = \sum_i P_{n,i}\quad \text{Equation 7}$$

results.

Hence it is possible to split up the task of calculating one long filter operation according to equation 2 into separate partial operations according to equations 4, 5 and 6.

When a new filter operation is to be carried out a first sub sequence Si of coefficients which are needed to evaluate equation 4 is accessed from the row having row address Ai of the RAM 512 by the computing units CU, where i=0. The same applies to the first subsequence i of buffered data words X–1 to X–63 which are stored in the row having the row address Ak, where k=i+offset=offset=5 (since i=0). The subsequence Si of data words is shifted in the data pipeline 502 one position to the right when the first new data word X0 from the input sequence 506 is shifted into shift register S0 of the data pipeline 502 during the processing interval at n=0. As a consequence the computing units CU each have one coefficient Ci and one data word X to be multiplied according to equation 4. Each computing unit outputs the result of the multiplication to adder tree 508 which accumulates the first partial result P0, 0 which is obtained.

To obtain the second partial result P0, 1 according to equation 5 the following procedure applies:

The old data word which dropped out of the data pipeline 502 due to the prior shifting operation is buffered in register 522 and fedback to the input of the data pipeline 502 via the mulitplexer 520. This data word is shifted into the shift register S0 while the buffered data words of the second subsequence Si of data words from the row Ak are accessed and shifted one position to the right in the data pipeline 502 (i is incremented). Also the required coefficients Cj which are needed to perform equation 5 are accessed from the second row of the RAM 512 by the computing units CU.

This enables the computing units to perform the required multiplications the results of which are outputted and added in adder tree 508 to obtain the second partial result P0, 1. The second partial result is added to the first partial result P0, 0 in the accumulator 524.

The above described sequence is carried out repetitively until all partial results P0, i-1 have been evaluated and accumulated. The final value which is accumulated in accumulator 524 is outputted at output 510.

It is to be understood that the computer system of FIG. 5 is not restricted to perform long filter operations of the above described type but can also be used to perform a plurality of shorter filter operations like explained with respect to FIG. 1–4 or a combination of both.

Figure 6:
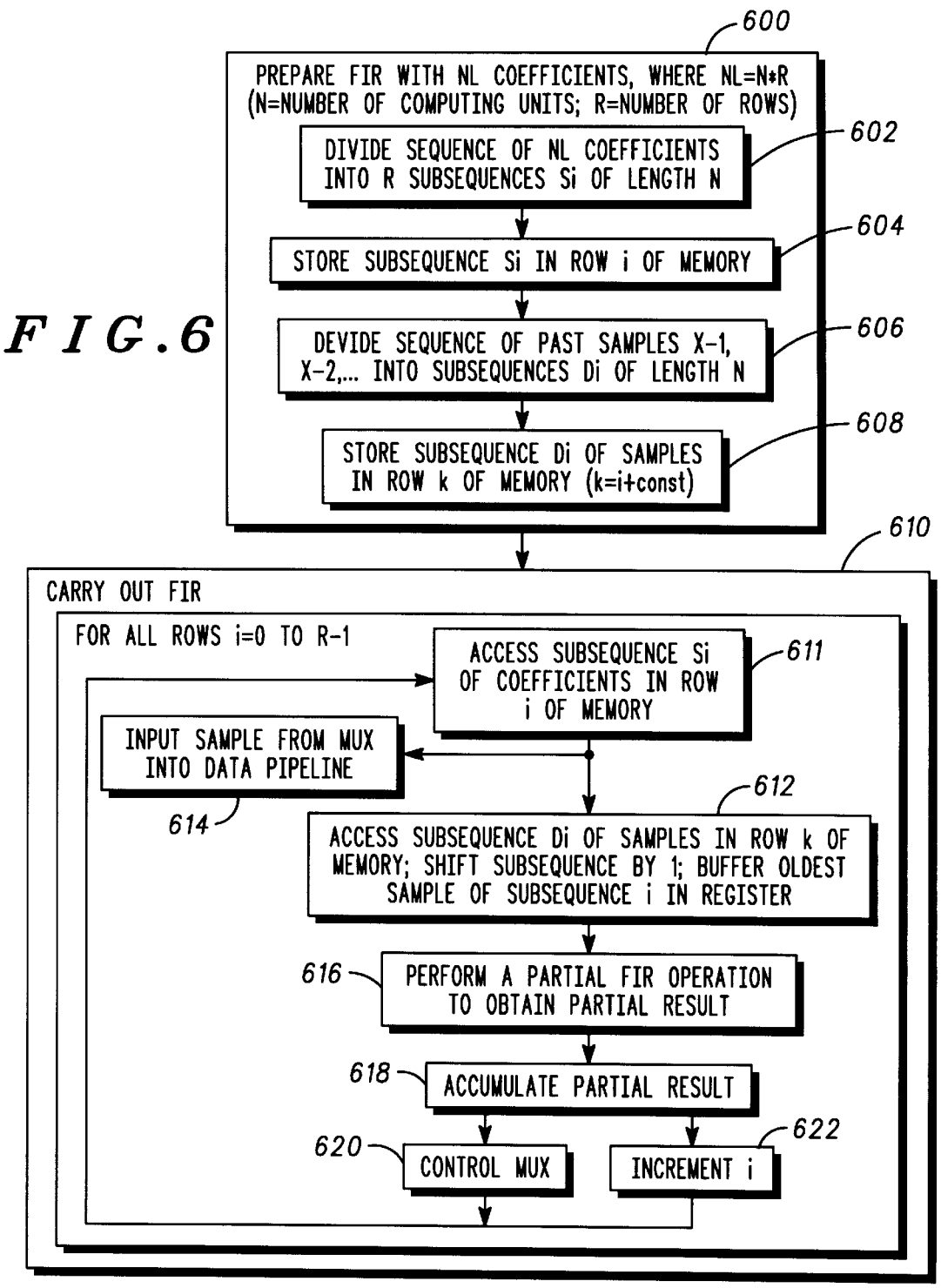
FIG. 6 is a schematic flow diagram of a method for performing the long finite impulse response filter operation according to the invention.

With respect to FIG. 6 a method of the invention to perform a long filter operation is described in more detail in the following. In step 600 the performance of a FIR operation having NL coefficients is prepared, where NL=N times R. N is the number of available parallel computing units and R is the number of required rows of memory to store the filter coefficients.

In step 602 the sequence of NL coefficients is divided into R subsequences Si each having a length of N coefficients. Subsequence i is stored in the row having the row address Ai in the memory array in step 602. The same applies analogously for the sequence of past samples belonging to the FIR operation to be carried out. The sequence of old data words X–1, X–2, . . . is also divided into subsequences Di of length N in step 606.

The subsequence Di of old data words is stored in a row having the row address Ak in the memory, where k=i plus a constant offset. This is done in step 608.

In step 610 the long FIR filter operation is actually carried out. This requires that initially the first subsequence Si=0 of coefficients in row i=0 of the memory is accessed by the computing units CU in step 611. Further this requires accessing of the corresponding first subsequence Di=0 of old data words in the row k of the memory, to shift this subsequence by 1 in the data pipeline and to buffer the oldest sample of the subsequence Di in a register coupled to the end of the datapipeline—like register 522 of FIG. 5. This is done in step 612.

In parallel a new data word X0 is inputted into the data pipeline in step 614. In step 616 a partial FIR operation according to equation 6 is carried out to obtain a first partial result which is accumulated in step 618. In step 620 the dropped oldest data word of the sequence Di which is buffered in the register is fedback into the data pipeline via a mulitplexor—like multiplexor 520 of FIG. 5. In parallel the value of i is incremented in step 622 to prepare for the calculation of the next partial result. Then the control returns back to step 611 in order to evaluate the next partial result according to equation 6 and the same sequence of steps is carried out again.

Figure 7:
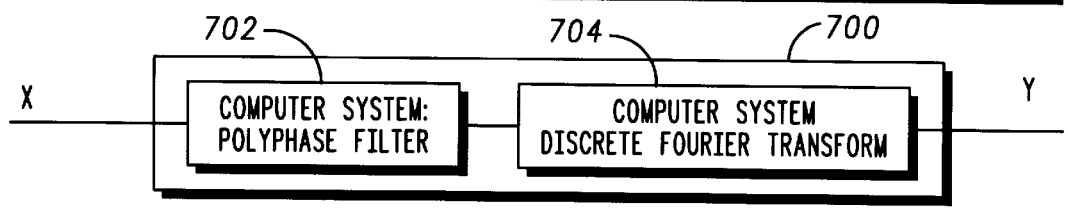
FIG. 7 is a schematic block diagram of a digital signal processing filter comprising two differently programmed computer systems of the type shown in FIG. 1.

With reference to FIG. 7 now a digital signal processing filter 700 is described in more detail. The digital signal processing filter 700 has a computer system 702 and a computer system 704. The computer system 702 has its output coupled to the input of the computer system 704. The computer system 702 receives data words X as an input sequence and the computer system 704 outputs filtered data words Y as a data output sequence.

The computer systems 702 and 704 are designed in accordance with the principles of the computer system 100, 200 and/or 500 of FIG. 1, 2 and 5, respectively.

Within the computer system 702 a polyphase filter is realized by storing the corresponding coefficients Cij in the memory of the computer system 702 in an analogous way as in the computer systems 100, 200 or 500.

Computer system 704 has the coefficients Cij stored in its memory which correspond to a discreet furrier transformation. As a consequence the filtered data words X which were filtered by the computer system 702 are taken as input data words and transformed to the discreet fourier transformation so that the output data sequence Y results.

Alternatively the computer system 700 can be realized based on only one computer system of the type of computer systems 702 and 704 whereby the one computer system is multiplexed. This can be accomplished if the data words which are filtered by the polyphase filter are fed back into the same computer system 702 to perform a discrete fourier transformation using the appropriate coefficients from the memory array. This way the overall system throughput of the digital signal processing filter 700 is reduced but only one computer system 702 or 704 is required.

Figure 8:
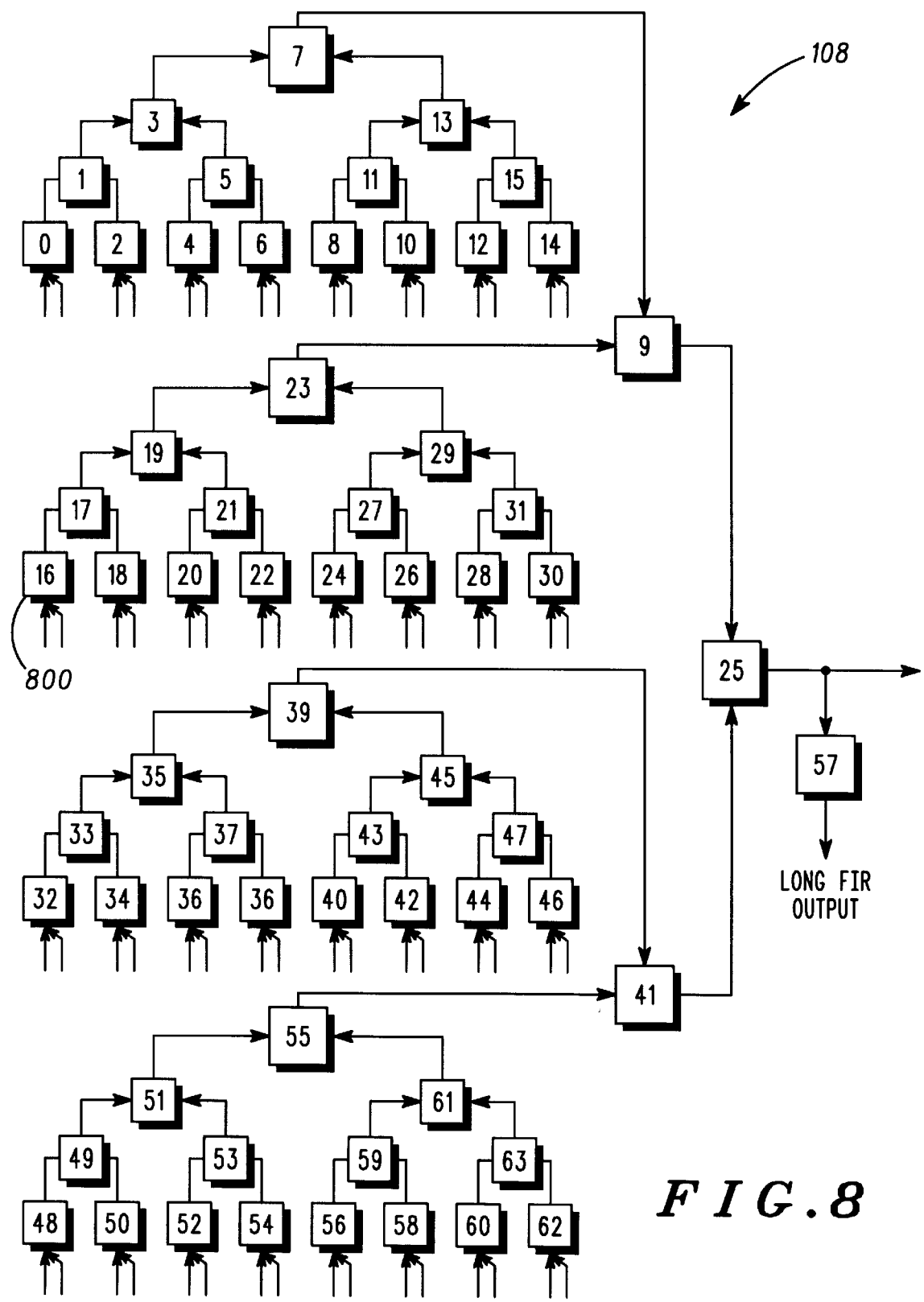
FIG. 8 is a schematic which illustrates the design of the adder which can be used in the computer system of FIG. 1.

With reference to FIG. 8 now the structure the adder tree 108 is explained in greater detail. The adder tree 108 has a number of 63 adder elements 800 which are symbolized by the boxes in FIG. 8. Each of the adder elements carries a number which indicates the index of a particular adder. Each of the adder elements 800 is capable to sum two input values and output the result.

At the lowest hierarchy level of the adder tree there are the adder elements 800 having the ihdices 0, 2, 4, 6, . . . , 60, 62. These adder elements 800 which are on the lowest level of hierarchy are connected to the computing units CU0 to CU63. In particular, the adder element 800 having the index 0 has its inputs connected to the outputs of the computing units CU0 and CU1. Likewise the adder element 800 having the index 2 has its input connected to the outputs of the computing units CU2 and CU3. In the general case an adder element 800 having the index L has its inputs connected to the outputs of the computing units CUL and CUL+1. This way all the computing units CU are connected to one adder element 800.

In the next level of hierarchy there are the adder elements 800 having the indices 1, 5, 11, 15, . . . 53, 59, 63. The adder elements 800 on the second level of hierarchy are each connected to a pair of adder elements 800 in the first level of hierarchy. In particular, the adder element 800 having the index 1 is connected to the adder elements 800 having indices 0 and 2 and likewise the adder element 800 having the index 5 is connected to the adder elements having indices 4 and 6. In the general case an adder element 800 having the index L in the second level of hierarchy is connected to the outputs of the adder elements 800 in the first level of hierarchy having the indices L−1 and L+1.

Likewise there is a third level of hierarchy containing the adder elements 800 having indices 3, 13, 19, . . . , 51, 61. As well as a fourth and fifth level of hierarchy. The adder elements 800 of the third fourths and fifth levels of hierarchy are interconnected according to the same principles as explained with respect to the lower levels of hierarchy.

As a consequence the adder element 800 having the index 25 outputs the result of the summation of all the outputs of the computing units CU0 to CU63.

As an option the adder tree 108 can be programmed to be used as an adder tree 508 so that the otherwise unused adder element 800 having the index 57 is used as an accumulator like explained with respect to accumulator 524 in FIG. 5. In this case the output of the adder element 800 having the index 57 is the output of the accumulator 524 as shown in FIG. 5.

What is claimed is:

1. A computer system comprising:

an input log converter for converting input data into a log domain;

a number N of parallel computing units;

a data pipeline having an input coupled to the input log converter, said data pipeline coupling the computing units so that data words can be shifted from one computing unit to the next;

a memory having rows and at least a number N of columns, each of said computing units being assigned to a different one of said columns;

a control unit being adapted to control the computer system so that to perform a first operation, each of said computing units accesses a memory location of a first row of said memory in its assigned column, and to perform a second operation interrupting said first operation, said data words in the data pipeline are buffered in a second row of said memory, wherein said control unit is adapted to control the computer system so that a sequence of first coefficients being representative of said first operation are stored in the first row, and a sequence of second coefficients being representative of said second operation are stored in a third row of said memory;

an inverse log converter coupled to outputs of the computing units to convert a result obtained by a computing unit back to the normal domain; and an adder tree being coupled to the inverse log converter to sum the results in the normal domain.

2. The computer system according to claim 1 said control unit being adapted to control the computer system so that the memory is logically divided along a row direction into a first and second memory area, the first row and the third row belong to the first memory area, whereby a row address of the first and the third row differ by one, and the second row and a fourth row belong to the second memory area, whereby a row address of the second and the fourth row differ by one, and the fourth row is used to buffer the data words in the data pipeline when the second operation is interrupted.

3. A computer system comprising:

an input log converter for converting input data into a log domain;

a number N of parallel computing units;

a data pipeline having an input coupled to the input log converter, said data pipeline coupling the computing units so that data words can be shifted from one computing unit to the next;

a memory having rows and at least a number N of columns, each of said computing units being assigned to a different one of said columns;

a control unit being adapted to control the computer system so that to perform a first operation, each of said computing units accesses a memory location of a first row of said memory in its assigned column, and to perform a second operation interrupting said first operation, said data words in the data pipeline are buffered in a second row of said memory, wherein said control unit being adapted to control the computer system so that (1)the memory is logically divided along a row direction into a first and second memory area; (2) a sequence of coefficients of an operation i is stored in a row having a row address Ai in the first memory area; and (3) data words of the data pipeline belonging to an operation i are buffered in a row having a row address Ak in the second memory area, said row address Ak having a fixed offset from the row address Ai; and an inverse log converter coupled to outputs of the computing units to convert a result obtained by a computing unit back to the normal domain; and an adder tree being coupled to the inverse log converter to sum the results in the normal domain.

4. The computer system according to claim 3 said control unit being adapted to control the computer system so that if the number Ni of coefficients of an operation i to be performed is lesser than the number N of computing units only the first N–Ni computing units are enabled.

5. The computer system according to claim 3 said control unit being adapted to control the computer system so that when an interruption of the operation i by an operation i+1 is over a next data word is shifted into the data pipeline and the buffered data words of the operation i are accessed from the row having the row address Ak by the computing units and shifted by one through the data pipeline.

6. The computer system according to claim 5 said computer system further comprising a multiplexer having its output coupled to the input of the data pipeline and being adapted to receive the next data word at its first input, the multiplexer having its second input coupled to a register, the register being coupled to an end of the data pipeline so that when the next data word is shifted into the data pipeline and the buffered data words of the operation i are accessed the oldest buffered data word of the operation i in the data pipeline is shifted into the register.

7. A digital signal processing filter comprising:

an input log converter for converting input data into a log domain;

a first computer system having a number N of parallel computing units and a data pipeline;

the data pipeline having an input coupled to the input log converter, said data pipeline coupling the computing units so that data words can be shifted from one computing unit to the next;

a memory having rows and at least a number N of columns, each of said computing units being assigned to a different one of said columns;

a control unit being adapted to control the computer system so that to perform a first operation each of said computing units accesses a memory location of a first row of said memory in its assigned column, and to perform a second operation interrupting said first operation, said data words in the data pipeline are buffered in a second row of said memory, wherein said control unit is adapted to control the computer system so that a sequence of first coefficients being representative of said first operation are stored in the first row, and a sequence of second coefficients being representative of said second operation are stored in a third row of said memory;

said first computer system implementing a polyphase filter, wherein said first and second operation belongs to a polyphase filter operation, wherein filtered data words from the first computer system are inputted into a second computer system to perform a second filter operation; and an inverse log converter coupled to outputs of the second computer system to convert a result obtained by a computing unit back to the normal domain.

8. The digital signal processing filter according to claim 7 said second filter operation being a discrete fourier transformation.

9. An electronic apparatus comprising a computer system having:

an input log converter for converting input data into a log domain;

a number N of parallel computing units;

a data pipeline having an input coupled to the input log converter, said data pipeline coupling the computing units so that a data word can be shifted from one computing unit to the next;

a memory having rows and at least a number N of columns, each of said computing units being assigned to a different one of said columns;

a control unit being adapted to control the computer system so that to perform a first operation each of said computing units accesses a memory location of a first row of said memory in its assigned column, and to perform a second operation interrupting said first operation, said data words in the data pipeline are buffered in a second row of said memory, wherein said control unit is adapted to control the computer system so that a sequence of first coefficients being representative of said first operation are stored in the first row, and a sequence of second coefficients being representative of said second operation are stored in a third row of said memory;

an inverse log converter coupled to outputs of the computing units to convert a result obtained by a computing unit back to the normal domain; and an adder tree being coupled to the inverse log converter to sum the results in the normal domain.

* * * * *